(12) United States Patent
Torregrosa et al.

(10) Patent No.: US 9,524,853 B2
(45) Date of Patent: Dec. 20, 2016

(54) ION IMPLANTATION MACHINE PRESENTING INCREASED PRODUCTIVITY

(71) Applicant: ION BEAM SERVICES, Peynier (FR)

(72) Inventors: Frank Torregrosa, Simiane (FR); Laurent Roux, Marseilles (FR)

(73) Assignee: ION BEAM SERVICES, Peynier (FR)

( * ) Notice: Subject to any disclaimer, the term of this patent is extended or adjusted under 35 U.S.C. 154(b) by 0 days.

(21) Appl. No.: 14/783,296

(22) PCT Filed: Apr. 9, 2014

(86) PCT No.: PCT/FR2014/000079
§ 371 (c)(1),
(2) Date: Oct. 8, 2015

(87) PCT Pub. No.: WO2014/167193
PCT Pub. Date: Oct. 16, 2014

(65) Prior Publication Data
US 2016/0071695 A1 Mar. 10, 2016

(30) Foreign Application Priority Data
Apr. 11, 2013 (FR) ..................... 13 00845

(51) Int. Cl.
*H01J 37/00* (2006.01)
*H01J 37/317* (2006.01)
(Continued)

(52) U.S. Cl.
CPC .......... *H01J 37/3171* (2013.01); *C23C 14/48* (2013.01); *C23C 14/50* (2013.01); *H01J 37/08* (2013.01);
(Continued)

(58) Field of Classification Search
CPC .................. H01J 2237/3321; H01J 37/32568; H01J 37/32412; C23C 16/5096; C23C 14/48; H01L 21/68771; H01L 31/1876
(Continued)

(56) References Cited

U.S. PATENT DOCUMENTS 4,664,890 A * 5/1987 Tawada .................... B09C 1/02
118/620
7,927,455 B2 * 4/2011 Kishimoto .............. C23C 16/24
118/723 E
(Continued)

FOREIGN PATENT DOCUMENTS

EP          0 165 618 A2    12/1985
WO      2010/033713 A2     3/2010
WO     WO 2010033713 A2 *   3/2010 ............. C23C 16/46

OTHER PUBLICATIONS

French Preliminary Search Report for FR 1300845 dated Aug. 29, 2013.
(Continued)

*Primary Examiner* — Michael Maskell
(74) *Attorney, Agent, or Firm* — Sughrue Mion, PLLC

(57) ABSTRACT

The present invention relates to an ion implantation machine 100 that comprises:
 an enclosure 101 that is connected to a pump device 102;
 a plasma source 115-121-122;
 a bias power supply 113;
 a gas inlet 117 leading into the enclosure; and
 a substrate-carrier 104 connected to the negative pole of the bias power supply and arranged inside the enclosure.

Figure 1:
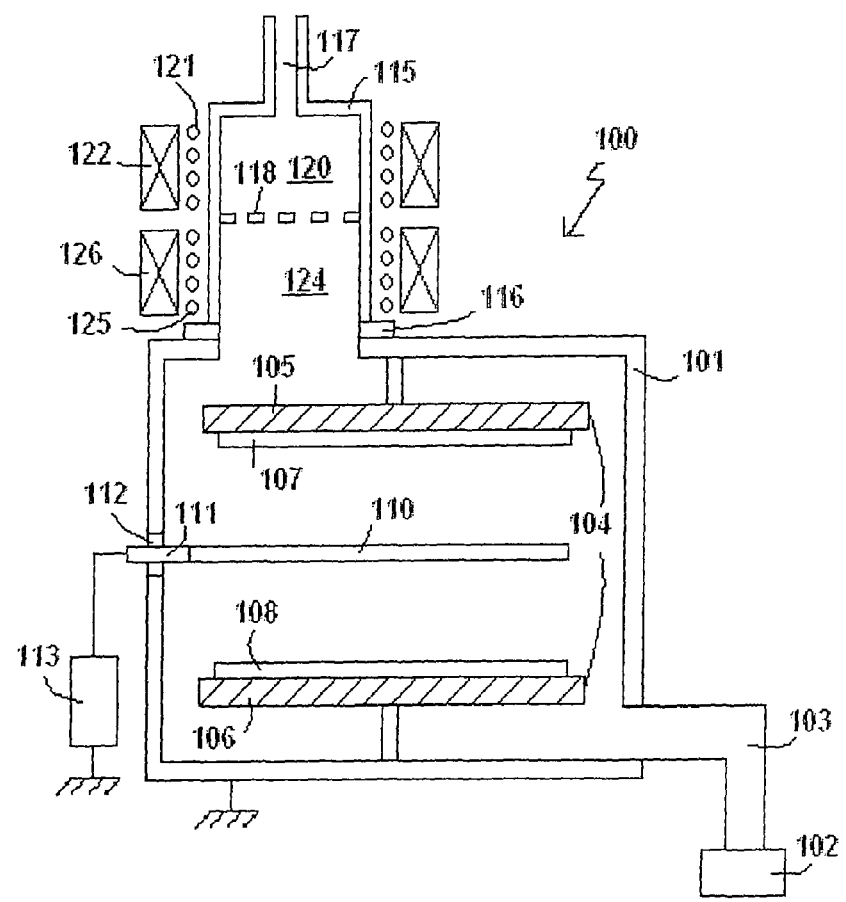

The machine is remarkable in that:
 the substrate-carrier 104 consists in at least two parallel plates 105-106;
 a reference electrode consists in at least one strip 110, this reference electrode being connected to the positive pole of the bias power supply; and
 the strip is interposed between the two plates.

12 Claims, 3 Drawing Sheets

(51) Int. Cl.
  *C23C 14/48* (2006.01)
  *C23C 14/50* (2006.01)
  *H01J 37/32* (2006.01)
  *H01J 37/08* (2006.01)
  *H01J 37/20* (2006.01)

(52) U.S. Cl.
  CPC .......... *H01J 37/20* (2013.01); *H01J 37/32412* (2013.01); *H01J 37/32541* (2013.01); *H01J 37/32568* (2013.01); *H01J 37/32715* (2013.01)

(58) Field of Classification Search
  USPC .......................................... 250/492.1–492.3
  See application file for complete search history.

(56) References Cited

U.S. PATENT DOCUMENTS

| | | | | |
|---|---|---|---|---|
| 8,092,640 | B2* | 1/2012 | Kishimoto | H01J 37/3244 118/723 E |
| 2006/0087211 | A1* | 4/2006 | Kishimoto | C23C 16/24 313/231.31 |
| 2006/0121704 | A1* | 6/2006 | Walther | C23C 14/48 438/510 |
| 2006/0191480 | A1* | 8/2006 | Kishimoto | H01J 37/3244 118/723 E |
| 2006/0219952 | A1* | 10/2006 | Mehta | H01J 37/32412 250/492.21 |

OTHER PUBLICATIONS

International Search Report for PCT/FR2014/000079 dated May 30, 2014.

\* cited by examiner

ION IMPLANTATION MACHINE PRESENTING INCREASED PRODUCTIVITY

CROSS REFERENCE TO RELATED APPLICATIONS

This application is a National Stage of International Application No. PCT/FR2014/000079 filed Apr. 9, 2014, claiming priority based on French Patent Application No. 1300845 filed Apr. 11, 2013, the contents of both of which are incorporated herein by reference in their entirety.

The present invention relates to an ion implantation machine presenting increased productivity.

The field of the invention is that of ion implantation machines using a plasma, in other words ion implanters operating in plasma immersion mode.

Ions are thus implanted into a substrate by immersing the substrate in a plasma and by biasing it with a negative voltage of a few tens of volts to a few tens of kilovolts (generally less than 100 kV), so as to create an electric field capable of accelerating the ions of the plasma towards the substrate.

The penetration depth of the ions is determined by their acceleration energy. It depends firstly on the voltage applied to the substrate and secondly on the respective natures of the ions and of the substrate.

The substrate, or the substrates if there are several, rest on a substrate-carrier that is in the form of a bedplate. The bedplate is arranged in an enclosure that is connected to a pump device.

The total surface area of the substrates is limited by the surface area of the bedplate, which is itself limited by the size of the enclosure.

An object of the present invention is thus to increase the productivity of an ion implantation machine, in other words to increase the total surface are of the substrates that can be processed by the machine.

According to the invention, an ion implantation machine comprises:
 an enclosure that is connected to a pump device;
 a plasma source;
 a bias power supply;
 a gas inlet leading into the enclosure; and
 a substrate-carrier connected to the negative pole of the bias power supply and arranged inside the enclosure;
 the machine being remarkable in that:
 the substrate-carrier consists in at least two parallel plates;
 a reference electrode consists in at least one strip, this reference electrode being connected to the positive pole of the bias power supply; and
 the strip is interposed between the two plates.

Because the substrate-carrier has at least two plates instead of a single bedplate as in the prior art, the surface area of the treated substrates is multiplied substantially by two.

Advantageously, the substrate-carrier has more than two plates, these plates being assembled at their bases on a baseplate.

With this arrangement, the number of substrates being implanted is further increased by a considerable amount.

Preferably, the reference electrode consists in a plurality of strips assembled at their bases to a support, each of the strips being interposed between two consecutive plates.

In a first embodiment, the plasma source is constituted by the substrate-carrier and the support, a discharge voltage being applied between these two elements.

In a second embodiment, the plasma source is a radiofrequency RF antenna surrounding the enclosure in register with the substrate-carrier, the antenna being connected to an RF generator.

In a third embodiment, the plasma source is arranged around the enclosure between the gas inlet and the substrate-carrier, the plasma source being powered by a generator.

It is desirable for the ion implantation machine to include magnetic coils arranged outside the enclosure around the substrate-carrier.

Under such circumstances, it is easier to ignite the plasma.

Optionally, the ion implantation machine includes means for heating the substrate-carrier.

This makes it possible to perform implantation while hot, thereby encouraging the reconstruction of defects and/or the activation of dopants in situ.

In a first option, the substrate-carrier is connected to ground.

In a second option, the reference electrode is connected to ground.

The ion implantation machine is preferably arranged in such a manner that the plates are either horizontal or else vertical.

Figure 2:
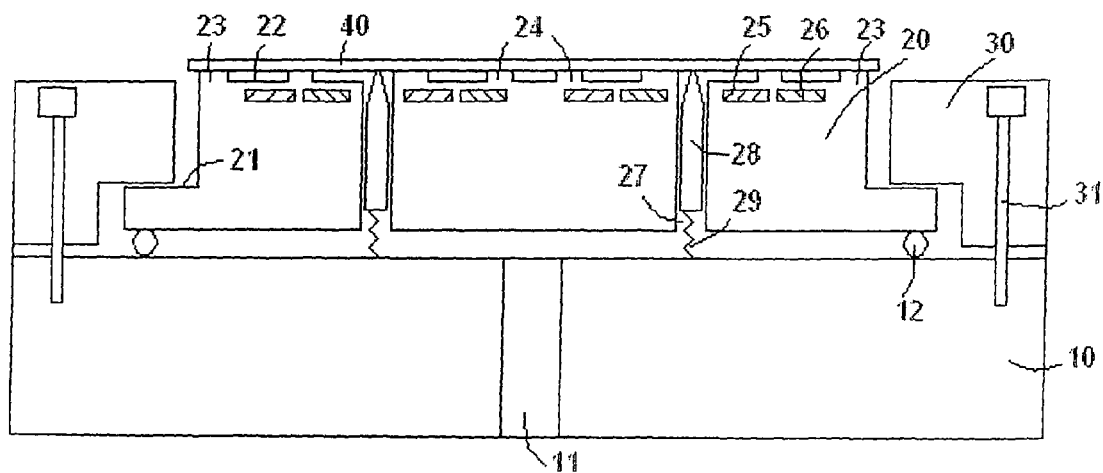
Figure 3:
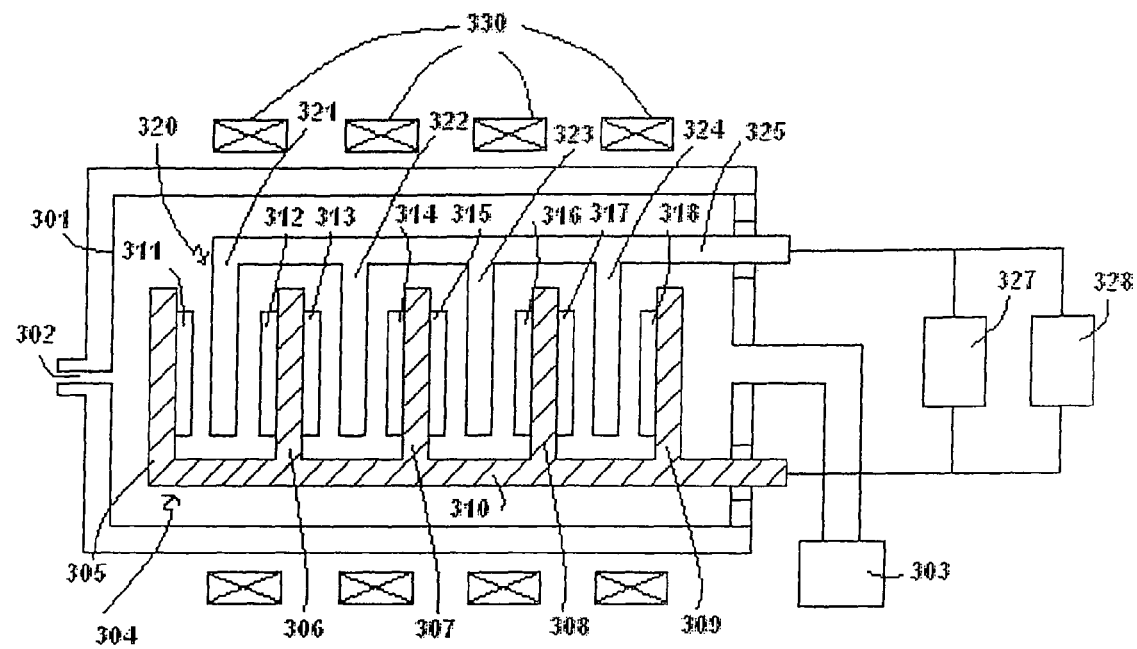
Figure 4:
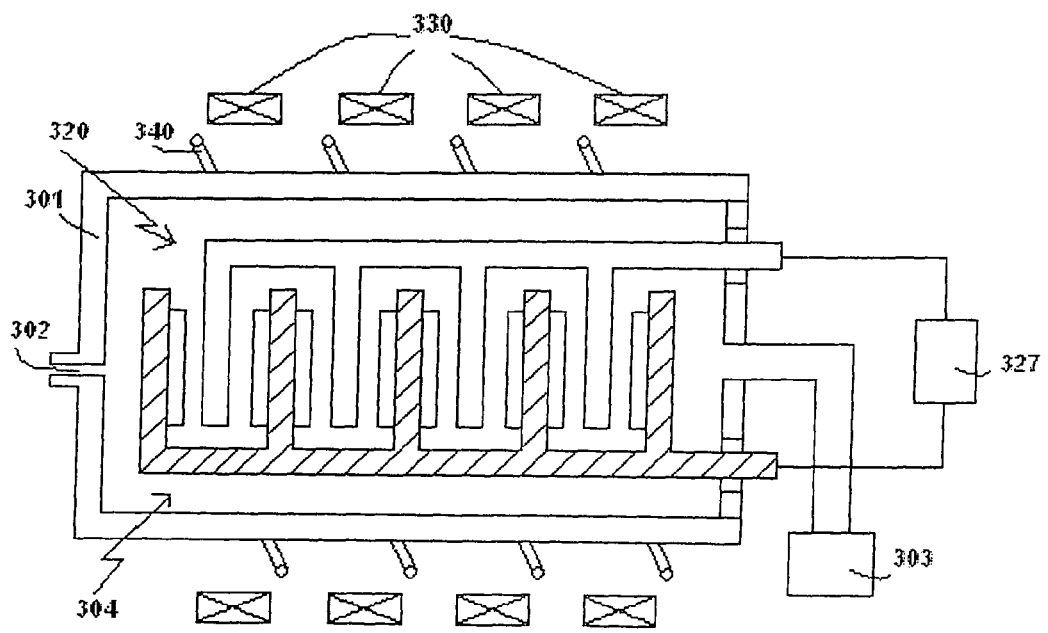
Figure 5:
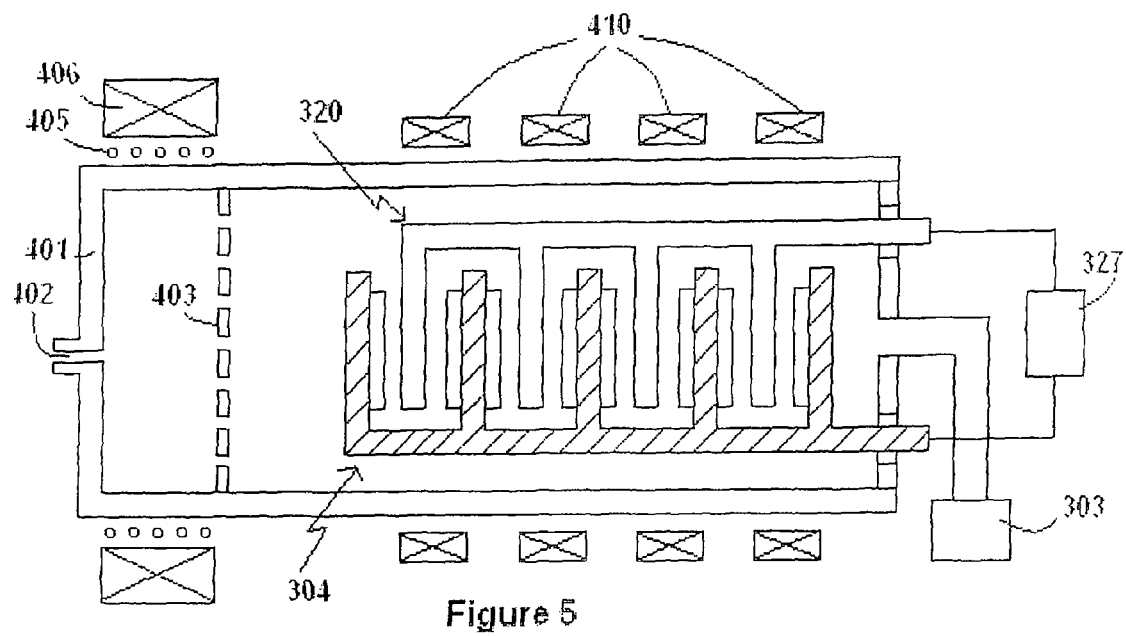
Figure 6:
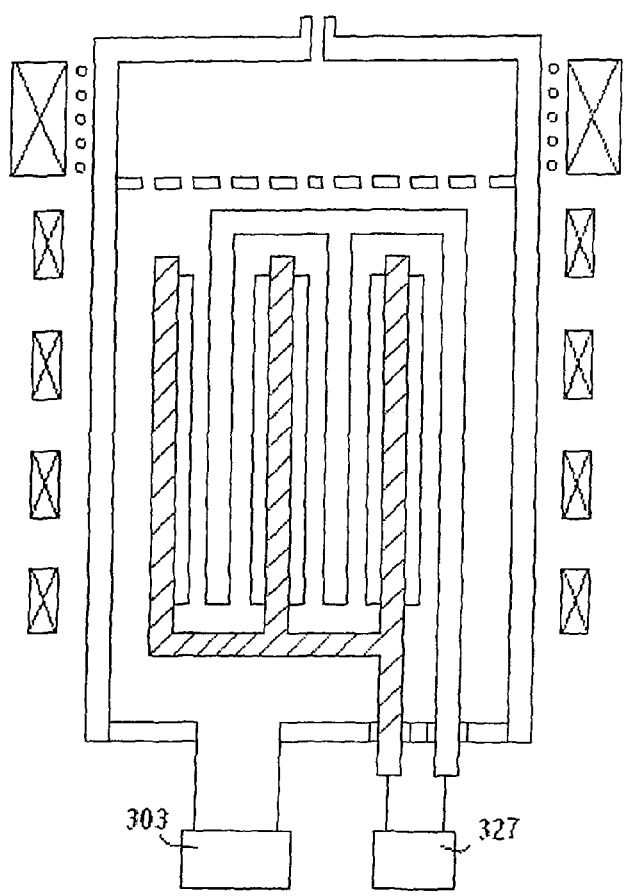

The present invention appears below in greater detail in the context of the following description of embodiments given by way of illustration and with reference to the accompanying figures, in which:

FIG. 1 is a diagrammatic section of an ion implantation machine having two plates;
 FIG. 2 is a diagram in section of an electrostatic substrate-carrier;
 FIG. 3 is a diagram in section of a first embodiment of a tubular ion implantation machine;
 FIG. 4 is a diagram in section of a second embodiment of a tubular ion implantation machine;
 FIG. 5 is a diagrammatic section of a third embodiment of a tubular ion implantation machine; and
 FIG. 6 is a diagrammatic section of a variant of this ion implantation machine.

Elements shown in more than one of the figures are given the same references in each of them.

With reference to FIG. 1, the ion implantation machine 100 is built around a vacuum enclosure 101. For microelectronic applications, it is recommended to use an enclosure made of aluminum alloy if it is desired to limit contamination from metal elements such as iron, chromium, nickel, or cobalt. It is also possible to use a coating of silicon or of silicon carbide.

Pump means 102 are connected via a pipe 103 to the bottom portion of the enclosure 101.

The substrate-carrier 104 is constituted by first and second horizontal plates 105 and 106 that are parallel and arranged facing each other. The first plate 105 is connected to the top of the enclosure 101 and it receives a first substrate 107 on its bottom face. The second plate 106 is connected to the base of the enclosure 101 and it receives a second substrate 108 on its top face. The two plates 105 and 106 are electrically conductive and they are electrically connected to the enclosure 101 which is grounded.

An electrically conductive strip 110 acts as a reference electrode. It is of a shape that is practically identical to the shape of the plates 105 and 106, and it is arranged between the plates, substantially parallel thereto. It is extended by a shank 111 that passes through the enclosure 101 via a high voltage passage 112. This high voltage passage 112 provides sealing, electrical insulation, and mechanical support for the strip 110.

A high voltage electrical power supply 113 constitutes a bias power supply and it has its negative pole connected to ground and its positive pole connected to the shank 111 of the strip 110. The positive potential applied to the strip 110 generally lies in the range a few tens of volts to a few tens of kilovolts. Advantageously, the applied voltage is pulsed in order to reduce the extent of the plasma sheath to a size that is smaller than the separation distance between the substrate-carrier and the reference electrode.

Conventionally, this power supply 113 may be constituted by a simple direct current (DC) voltage generator having its negative pole connected to ground. Nevertheless, the invention is applicable regardless of the means used for applying negative bias to the substrate-carrier in the context of implantation in plasma immersion mode, and regardless of whether the bias is constant or varying. It should be understood that the substrates 107 and 108, in particular if they are insulating, have a tendency to become positively charged.

The plasma source 115 is placed on the top portion of the enclosure 101. This source 115 is in the form of a generally cylindrical body that extends between an initial section (at the top of the figure) and a terminal section (at the bottom of the figure). A connection flange 116 serves to fasten the terminal section of the plasma source 115 to the enclosure 101. The initial section has a gas inlet 117 for feeding the plasma.

The plasma source is preferably made of silica glass or aluminum in order to limit problems of contamination.

A partition 118 pierced by a plurality of through holes, and preferably made of silica glass, is arranged between the initial section and the terminal section of the source 115, in order to create head loss.

By way of example, for a cylindrical body having a diameter of about 15 centimeters (cm), the holes in the partition 118 have a diameter of the order of a few millimeters (mm). In order to facilitate maintenance operations, the partition 118 may be removable.

The space defined by the partition 118 and the initial section constitutes a main chamber 120. This main chamber 120 is surrounded on the outside by a first ionization cell that comprises firstly a first RF antenna 121 and secondly, as an option, a first confinement coil 122. In this example, the antenna 121 is constituted by a few turns of an electrical conductor, e.g. a tube or a strip of copper.

It is naturally possible to use any type of plasma source: a discharge source, an inductively coupled plasma (ICP) source, a helicon source, a microwave source, an arc source.

The head loss between the body of the plasma source 115 and the enclosure 101 serves to establish a pressure difference between these two elements that lies in the range one to two orders of magnitude.

The space defined by the partition 118 and the terminal section constitutes an auxiliary chamber 124.

This auxiliary chamber 124 is optionally also surrounded on the outside by a second ionization cell comprising firstly a second RF antenna 125 and secondly a second confinement coil 126.

It would also be possible to provide a single confinement coil and a single antenna covering both chambers 120 and 124 of the plasma source 115.

The substrates 107 and 108 are held on the substrate-carrier 104 by any means known to the person skilled in the art, e.g. using conductive adhesive, or conductive grease, or by mechanical clamping. The second substrate 108 may be held on the second plate 106 by gravity.

Alternatively, and with reference to FIG. 2, it is possible to use an electrostatic substrate-carrier. The corresponding setup comprises essentially three portions:
  a biased table 10;
  a substrate-carrier 20; and
  a clamping flange 30.

The table 10 is biased at high voltage (DC or pulsed) and it is in the form of a conductive bedplate provided with a duct 11 that opens out into both of its faces. The function of the duct 11 is described in greater detail below.

The insulating substrate-carrier 20 rests on the table 10 via a gasket 12 arranged at the periphery of the bottom face of the substrate-carrier. The substrate-carrier is in the form of a cylinder that bears against its top face, this cylinder being provided with a shoulder 21 that projects from its base.

The clamping flange 30 serves to clamp the substrate-carrier 20 onto the table 10 by bearing against the shoulder 21, with the bearing force being determined by a plurality of screws 31.

The top face 22 of the substrate-carrier 20 presents a ring 23 at its periphery, and it also presents a plurality of studs 24 distributed inside the ring. The ring 23 and the studs 24 are of identical thickness that typically has a value lying in the range 10 micrometers (µm) to 15 µm. The tops of the ring 23 and of the studs 24 thus define a bearing plane on which the substrate 40 rests.

Electrodes of a first type are used for electrostatic clamping of the substrate. These electrodes are arranged in pairs. They are located in a plane parallel to the top face 22, which plane is very close to the plane of the top face. They are made using any means known to the person skilled in the art, for example by having recourse to the so-called "thick layer" technology.

The pair that is on the right in the figure comprises a positive electrode 25 or anode and a negative electrode 26 or cathode. The principle consists in providing a pair of capacitors:
  an anode-substrate capacitor; and
  a substrate-carrier capacitor.

Furthermore, it is appropriate to ensure electrical contact between the substrate 40 and the biased table 10, with this being done by means of electrodes of a second type.

For this purpose, a plurality of channels pass right through the substrate-carrier 20. The channel 27 that is on the right in the figure receives a spike 28 mounted on a spring 29 that bears against the table 10 and that thus presses the spike 28 against the substrate 40. The spike-and-spring pair constitutes an electrode of the second type, and one such pair is provided in each channel.

The duct 11 provided in the table serves to store the first space between the bottom face of the substrate-carrier 20 and said table with helium.

The second space lying between the top face 22 of the substrate-carrier 20 and the substrate 40 is also full of helium as a result of the channels. It is even possible to provide an additional opening (not shown) passing through the substrate-carrier so as to put the first and second spaces into communication.

Means specific for manipulating the substrate are not shown since they are known to the person skilled in the art.

The invention thus makes it possible to double the number of substrates compared with the prior art. It also makes it possible to further increase this number in significant manner.

With reference to FIG. 3, in a first embodiment, the enclosure 301 in this example is in the form of a horizontal tube having a gas inlet 302 in its left-hand portion and pump means 303 on its right-hand portion.

The substrate-carrier 304 comprises a plurality of identical vertical plates, there being five plates 305, 306, 307, 308, and 309 in the present example. These plates are parallel and they are arranged in such a manner that their projections along a perpendicular axis are substantially identical. These plates have their bottom bases secured to a horizontal baseplate 310.

The first plate 305 (on the left in the figure) receives a first substrate 311 on its right-hand face.

The second plate 306 (to the right of the first plate 305) receives a second substrate 312 on its left-hand face and a third substrate on its right-hand face.

The third plate 307 (to the right of the second plate 306) receives a fourth substrate 314 on its left-hand face and a fifth substrate 315 on its right-hand face.

The fourth plate 308 (to the right of the third plate 307) receives a sixth substrate 316 on its left-hand face and a seventh substrate 317 on its right-hand face.

The fifth plate 309 (to the right of the fourth plate 308) receives an eighth substrate 318 on its left-hand face.

The reference electrode 320 has a plurality of identical strips that are likewise vertical, there being four strips 321, 322, 323, and 324 in the present example. These strips are parallel and they are arranged in such a manner that their projections along a perpendicular axis are substantially identical. These strips are secured at their top faces to a horizontal support 325. Each of said strips 321, 322, 323, and 324 is interposed between two consecutive plates: the first strip 321 lies between the first and second plates 305 and 306, the second plate 322 lies between the second and third plates 306 and 307, and so on.

The baseplate 310 and the support 325 both extend to the outside of the enclosure 301 via respective high voltage passages. They are connected firstly to a high voltage electrical power supply 327 so that the baseplate is negatively biased. They are also connected to a discharge power supply 328 that is used for igniting the plasma.

Magnetic coils 330 are optionally arranged around the enclosure in register with the support in order to confine the plasma.

With reference to FIG. 4, in a second embodiment, the enclosure is identical to that described above with reference to FIG. 3. The discharge power supply is omitted and it is replaced by an RF antenna 340 that surrounds the enclosure 301 in register with the substrate-carrier 304. This antenna 340 is connected to a generator (not shown). In this embodiment likewise, it is possible to have confinement coils 330 that are arranged around the RF antenna 340. Naturally, the enclosure must be transparent to the RF field produced by the antenna; for example it may be made of silica glass or of alumina.

With reference to FIG. 5, in a third embodiment, the plasma source is offset around the enclosure 401 in an empty space that exists between the gas inlet 402 and the substrate-carrier 304.

The plasma source is analogous to that described with reference to FIG. 1 except that it now forms an integral portion of the enclosure 401. There is thus likewise a partition 403 pierced by through holes, this partition being substantially vertical and lying between the gas inlet 402 and the substrate-carrier 304.

The space present between the gas inlet 404 and the partition 403 thus defines a main chamber.

This main chamber is surrounded on the outside by an ionization cell that comprises firstly an RF antenna 405 and secondly, as an option, a confinement coil 406.

Once more, it is possible to provide another set of confinement coils 410 surrounding the enclosure 401 in register with the substrate-carrier 304. This improves the uniformity of the plasma.

The invention also makes it possible to perform implantation at high temperature. Using an enclosure 401 in the form of a tube, it is possible to add external heating by means of heater resistance elements (not shown) surrounding the tube. It is thus possible to perform hot ion implantation so as to enhance the reconstruction of defects and/or activate dopants in situ and/or control the presence of unwanted deposits (in particular when using hydrides such as $B_2H_6$, $AsH_3$, or $PH_3$). The heating temperature is measured by a thermocouple and it serves as a setpoint for servo-controlling the power supply to the resistance elements.

Concerning the biasing of the substrate-carrier, three configurations are available:
    the high voltage power supply has its positive pole connected to the reference electrode and to ground, with its negative pole being connected to the substrate-carrier;
    the high voltage power supply has its negative pole connected to the substrate-carrier and to ground, with its positive pole being connected to the reference electrode; or
    the high voltage power supply has its negative pole connected to the substrate-carrier and its positive pole connected to the reference electrode, with neither of these poles being connected to ground.

The high voltage power supply may be DC or pulsed. It is even possible to envisage having recourse to biasing at high frequency in the range of hundreds of kilohertz (kHz).

The description above shows an enclosure having its axis horizontal. It is equally possible for the tube to be arranged vertically. Under such circumstances, the plates are horizontal and the substrates on the top faces of the plates do not need to be fastened, since they are held thereon merely by gravity.

With reference to FIG. 6, in a variant, the tube is vertical but the plates and the strips are also vertical. The substrates are thus arranged parallel to the gas stream, thereby improving the uniformity of implantation.

The embodiments of the invention described above have been selected because of their concrete nature. Nevertheless, it is not possible to list exhaustively all possible embodiments covered by the invention. In particular, any of the means described may be replaced by equivalent means without going beyond the ambit of the present invention.

The invention claimed is:

1. An ion implantation machine comprising:
    an enclosure that is connected to a pump device; a plasma source;
    a bias power supply;
    a gas inlet leading into the enclosure; and
    a substrate-carrier connected to the negative pole of the bias power supply and arranged inside said enclosure;
    the machine being characterized in that:
    said substrate-carrier comprises at least two parallel plates each for carrying at least one substrate and all connected to said negative pole of the bias power supply;
    a reference electrode comprises at least one strip, this reference electrode being connected to the positive pole of said bias power supply; and said strip is interposed between the two plates.

2. An ion implantation machine according to claim 1, characterized in that said substrate-carrier has more than two plates, these plates being assembled at their bases on a baseplate.

3. An ion implantation machine according to claim 2, characterized in that said reference electrode consists in a plurality of strips assembled at their bases to a support, each of said strips being interposed between two consecutive plates.

4. An ion implantation machine according to claim 2, characterized in that said plasma source is constituted by said substrate-carrier and said support, a discharge voltage being applied between these two elements.

5. An ion implantation machine according to claim 1, characterized in that said plasma source is a radiofrequency (RF) antenna surrounding said enclosure in register with said substrate-carrier, said antenna being connected to an RF generator.

6. An ion implantation machine according to claim 1, characterized in that said plasma source is arranged around said enclosure(401) between said gas inlet and said substrate-carrier, said plasma source being powered by a generator.

7. An ion implantation machine according to claim 4, characterized in that it includes magnetic coils arranged outside said enclosure around said substrate-carrier.

8. An ion implantation machine according to claim 4, characterized in that it includes heater means for heating said substrate-carrier.

9. An ion implantation machine according to claim 1, characterized in that said substrate-carrier is connected to ground.

10. An ion implantation machine according to claim 1, characterized in that said reference electrode is connected to ground.

11. An ion implantation machine according to claim 1, characterized in that said plates are horizontal when said machine is operating.

12. An ion implantation machine according to claim 1, characterized in that said plates are vertical when said machine is operating.

* * * * *